(12) United States Patent
Melanson

(10) Patent No.: US 7,221,302 B1
(45) Date of Patent: *May 22, 2007

(54) DELTA-SIGMA MODULATOR COEFFICIENT CALIBRATION METHOD AND APPARATUS

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 11/312,842

(22) Filed: Dec. 20, 2005

(51) Int. Cl.
*H03M 3/00* (2006.01)

(52) U.S. Cl. .................... 341/143; 341/118; 341/120; 341/131

(58) Field of Classification Search .............. 341/118, 341/120, 131, 143
See application file for complete search history.

(56) References Cited

U.S. PATENT DOCUMENTS

| | | | |
|---|---|---|---|
| 5,323,157 A * | 6/1994 | Ledzius et al. | 341/143 |
| 5,786,951 A | 7/1998 | Welland et al. | |
| 5,903,857 A | 5/1999 | Behrens et al. | |
| 6,111,529 A | 8/2000 | Maulik et al. | |
| 6,271,781 B1 * | 8/2001 | Pellon | 341/143 |
| 6,313,961 B1 | 11/2001 | Armstrong et al. | |
| 6,380,874 B1 * | 4/2002 | Knudsen | 341/118 |
| 6,449,569 B1 * | 9/2002 | Melanson | 702/65 |
| 6,462,685 B1 * | 10/2002 | Korkala | 341/131 |
| 6,489,913 B1 * | 12/2002 | Hansen et al. | 341/156 |
| 6,680,682 B2 * | 1/2004 | Arnaud et al. | 341/155 |
| 6,738,003 B2 | 5/2004 | Melanson | |
| 6,970,120 B1 * | 11/2005 | Bjornsen | 341/120 |
| 7,034,725 B2 * | 4/2006 | Gandolfi et al. | 341/143 |
| 7,042,375 B1 * | 5/2006 | van Engelen | 341/131 |
| 2006/0164272 A1 * | 7/2006 | Philips et al. | 341/143 |

* cited by examiner

*Primary Examiner*—Khai M. Nguyen
(74) *Attorney, Agent, or Firm*—Andrew M. Harris; Mitch Harris, Atty at Law, LLC

(57) ABSTRACT

A delta-sigma modulator coefficient calibration method and apparatus provides for adjustment of the modulator coefficients, and thus the modulator noise transfer function (NTF), in operational environments. A noise signal is injected into the feedback loop of the delta-sigma modulator either before or after the quantizer and the output of the modulator is correlated with the noise signal. The delta-sigma modulator has adjustable coefficients that are adjusted in conformity with the correlator output to achieve a more desirable noise transfer function. The correlator may include a tapped delay line and multiple correlators for simultaneously measuring each modulator coefficient directly, or may include a variable delay and a single correlator for measuring each coefficient sequentially.

17 Claims, 5 Drawing Sheets

DELTA-SIGMA MODULATOR COEFFICIENT CALIBRATION METHOD AND APPARATUS

CROSS-REFERENCE TO RELATED APPLICATIONS

The following U.S. patent application is related to co-pending U.S. patent application Ser. No. 11/312,818 filed concurrently with this application by the same inventor, assigned to the same Assignee and entitled "PHASE-MEASURING DELTA-SIGMA MODULATOR CALIBRATION METHOD AND APPARATUS", the specification of which is incorporated herein by reference.

BACKGROUND OF THE INVENTION

1. Field of the Invention

The present invention relates generally to delta-sigma modulators/converters, and more specifically, to calibration of a delta-sigma modulator to adjust the modulator's noise transfer function.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. Feedback applied from the output of the quantizer through the loop filter of the converter continuously attempts to force the quantization error of the modulator to zero. The "quantization noise" is the AC result of this process (i.e., the components of the quantization error having a frequency greater than zero).

The frequency distribution of the above-described "quantization noise" can be modeled as a noise transfer function (NTF) response to a unit white noise source, although in actuality the source of the "quantization noise" is not noise, and the NTF is somewhat signal-dependent as well as being inherently dependent on the order of the delta-sigma converter and the converter coefficients.

The NTF can be adjusted advantageously to a desirable shape by the design of the loop filter, including the selection of feedback coefficients applied to the various stages of the loop filter from the output of the quantizer. For example, in most ADC and DAC applications, the NTF is shaped to shift the energy of the quantization noise to a high frequency, typically at least twice the sample frequency, so that a subsequent digital filter can be applied to remove the quantization noise without aliasing the quantization noise back to the frequency band of interest. Very sophisticated design techniques including high-order loop filters can be employed to tune the NTF to achieve very high linearity and low actual quantization error after filtering.

However, in continuous-time loop filter delta-sigma modulators, the tuning of the loop filter is dependent on circuit parameters, such as resistor and capacitor values for traditional analog integrators, or capacitor ratios in switched-capacitor implementations. In such applications, the NTF can vary substantially from device to device and over temperature, in large part due to the gains of internal stages of the loop filter, which alter the integrator constants.

Therefore, it would be desirable to provide a calibration method and apparatus for delta-sigma modulation in which the noise transfer function can be measured and the noise transfer function response adjusted. It would further be desirable to provide such a method and apparatus that can perform such measurements and adjustments in a mode of operation as close to actual operation as possible.

SUMMARY OF THE INVENTION

The above stated objectives are achieved in a method and apparatus for calibration in a delta-sigma modulator. The method is a method of operation of the apparatus.

The apparatus includes a delta-sigma modulator having adjustable coefficients and a noise generator for injecting a signal into the feedback loop of the delta-sigma modulator, either before or after the quantizer. The apparatus also includes a correlator for determining a response of the delta-sigma modulator by correlating the output of the modulator with the injected noise to measure the noise transfer function (NTF) response. The apparatus further includes a circuit for adjusting the adjustable coefficients of the modulator in conformity with the measured NTF response, in order to tune the NTF of the modulator.

The correlator may include a tapped delay line and multiple correlators for directly measuring each coefficient simultaneously. Alternatively, a single correlator with an adjustable delay may be employed to measure each coefficient sequentially.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for calibrating a delta-sigma modulator. The method calibrates the modulator by measuring the response of the noise transfer function (NTF). A white noise source is injected into the modulator feedback loop and the output of the modulator is correlated with various delayed versions of the noise source, including the non-delayed term. Since white noise (generally supplied by a pseudo-random number generator) is not self-correlated at any time other than the instant time (for which the match is unity yielding a perfect correlation of +1), the output of the correlator will yield the Z-domain coefficient corresponding to the particular selected delay, provided the delay corresponds to a coefficient (i.e., the delays are spaced at a sample rate increment apart).

Either an adjustable delay is used to select the particular Z-domain coefficient of the NTF for measurement, and the apparatus is stepped through the various delay lengths to obtain sufficient information about the NTF shape, or a plurality of correlators is used to yield simultaneous results, each having a corresponding delay length. If only one correlator is implemented, then the measurement will take longer for the same level of accuracy, as the measurement must be repeated for each desired coefficient. A level of convergence can be established by summing the measured coefficients until a step response is obtained, ensuring that enough data has been accumulated for the correlation of the noise to be sufficiently randomized. Since the integral of the impulse represented by the noise is normalized to unity, a step response indicates that the totality of the measured Z-domain coefficients represents the expected infinite response to the noise.

After the NTF response is measured, the NTF of the modulator is adjusted by adjusting at least one adjustable coefficient of the modulator. The apparatus comprises a delta-sigma modulator with additional response measuring and calibration control circuits, including the correlator circuits described above and an adjustable circuit or circuits within the modulator that are adjusted in conformity with the measured response to the injected noise signal.

Figure 1:
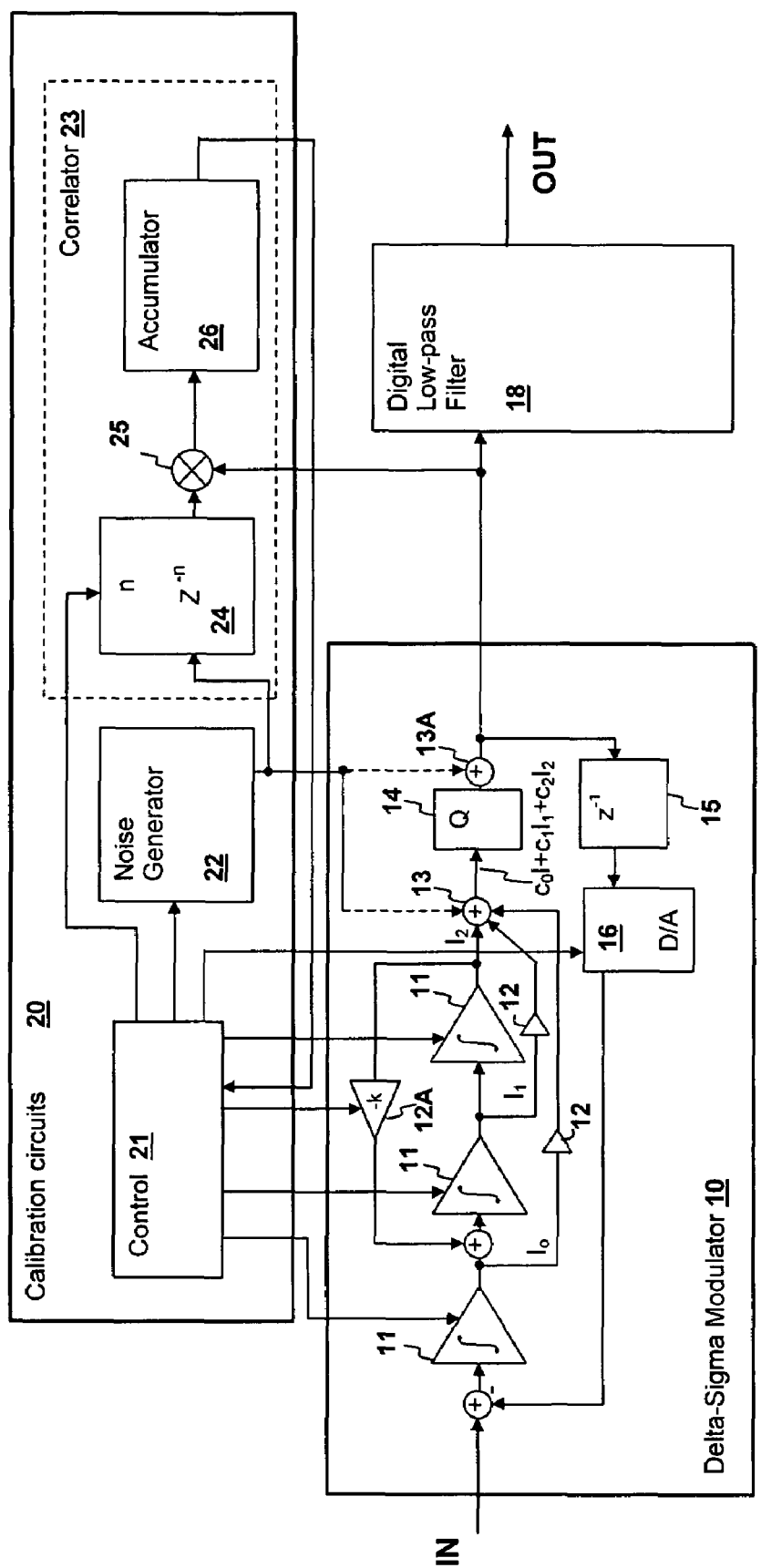
FIG. 1 is a block diagram depicting an apparatus in accordance with an embodiment of the present invention.

Referring now to FIG. 1, a circuit in accordance with an embodiment of the present invention is shown. A noise shaping delta-sigma modulator 10 has an input IN and provides a noise-shaped output from a quantizer 14. The output is applied to a digital low-pass filter 18, thereby providing a digital output OUT corresponding to the analog input IN. Thus, the depicted circuit forms an ADC. However, the techniques of the present invention apply to any noise-shaping delta-sigma modulator in which it is desirable to tune the modulator to improve the noise transfer function. The invention is especially applicable to continuous time analog loop filter type delta-sigma modulator, and in particular to those that are implemented with resistor-capacitor (RC) integrators, which typically have the largest process and temperature variations. The invention is also applicable to other analog loop delta-sigma modulators, such as those having switched-capacitor loop filters, providing further precision in the setting of the NTF response beyond the level of control provided by matched capacitor ratios in such implementations.

Delta-sigma modulator 10 implements a noise shaper using a series of integrator stages 11 that receive an input signal from the previous stage. The outputs of integrators 11 are scaled by scaling circuits 12 and are combined by a combiner 13, forming a third-order feed-forward loop filter. Combiner 13 may be a summing amplifier, and scaling circuits 12 may be resistors that set the gain of the summing amplifier with respect to the output of each integrator 11. Quantizer 14 receives the output of combiner 13 and provides feedback to the integrator stages via a delay 15 and a coarse DAC 16.

The integrator constants of each integrator 11 may be adjustable as shown. The adjustment is provided by one or more signals provided from a control circuit 21 within a set of calibration circuits 20. Control circuit 21 may also or alternatively set the gain of DAC 16 and/or the gain of an adjustable gain amplifier 12A that provides the local feedback around the second and third stages of the loop filter of delta-sigma modulator 10. For the sake of generality, control circuit 21 is shown adjusting each integrator, the gain of DAC 16 and the gain of adjustable gain amplifier 12A, although not all adjustment points may be needed to control the modulator NTF. Scaling circuits 12 may also be replaced with programmable gain amplifiers and used to adjust the feed-forward coefficients of modulator 10. In general, any control that provides sufficient adjustment of the NTF in order to improve response of the modulator will be sufficient to practice the present invention. All of the circuits depicted in FIG. 1 are implemented within a single integrated circuit die, although that is not a requirement to practice the present invention.

Calibration circuits 20 also include a noise generator 22 that injects a test signal into the feedback loop of delta-sigma modulator 10 either by combination at the input to quantizer 14 via an input to combiner 13 or by introduction to an additional combiner 13A at the output of quantizer 14. The injected signal may be single-bit or multi-bit noise source, as generally provided by a pseudo-random number (PRN) generator. A single-bit signal is advantageous in that such a signal can be used as either a digital or analog noise source and can be correlated with another signal via a single-bit multiplier (e.g., a logical exclusive-OR gate). For the implementation depicted, a digitally generated signal would be more easily combined with the digital output of quantizer 14, while an analog signal would be more easily combined at the final analog combiner 13. However, the depicted embodiment is intended to illustrate the invention and will be understood to encompass other architectures with the appropriate addition of appropriate conversion between digital and analog domains as needed.

Because the output of noise generator 22 is injected into quantizer 14, rather than the input of delta-sigma modulator 10, the action of the modulator loop is to cancel the injected signal as quantization error (in this case artificially injected quantization error). Therefore, by direct comparison of the output of delta-sigma modulator 10 with the output of noise generator 22, it is possible to determine the response of the modulator to quantization noise, or in other words, measure the NTF.

In the present invention, such measurements are made by a correlator 23 that correlates the injected noise with the output resulting from the response to the noise, thus providing a direct measurement of the response. In the embodiment depicted in FIG. 1, correlator 23 includes an accumulator 26 that receives the output of a multiplier 25 that mixes the output of noise generator 22 delayed by a programmable delay 24 with the output of delta-sigma modulator 10. Control logic 21 sets the delay value of programmable delay 24 to a length of n samples, in accordance with the particular Z-domain coefficient of the NTF being measured. One enough samples have been accumulated for each coefficient measured (e.g., 10,000 to 10 million samples), the relative values of the coefficients reveal the shape of the NTF and thus the deviation of coefficients of modulator 10 from the desired response of the NTF in the time domain. Control logic 21 can either map a complex relationship between each Z-domain coefficient and the modulator feed-forward coefficients or the values of the modulator coefficients can be set in approximation in conformity with one or more corresponding Z-domain coefficients as measured. In general, the earliest terms of the Z-domain transfer function (those corresponding to the shortest delays) are most strongly related to the feed-forward coefficients from earlier stages of the modulator loop filter and similarly with the later Z-domain coefficients and the later-stage coefficients. After the calibration is made, noise generator 22 may be disabled by calibration control circuits 21, or left in place as a dither signal during operation if a low noise level is injected. Continuous calibration may be employed in this implementation, with periodic adjustment of the modulator coefficients, as the correlations performed will reject the input signal and only determine the NTF.

Figure 2B:
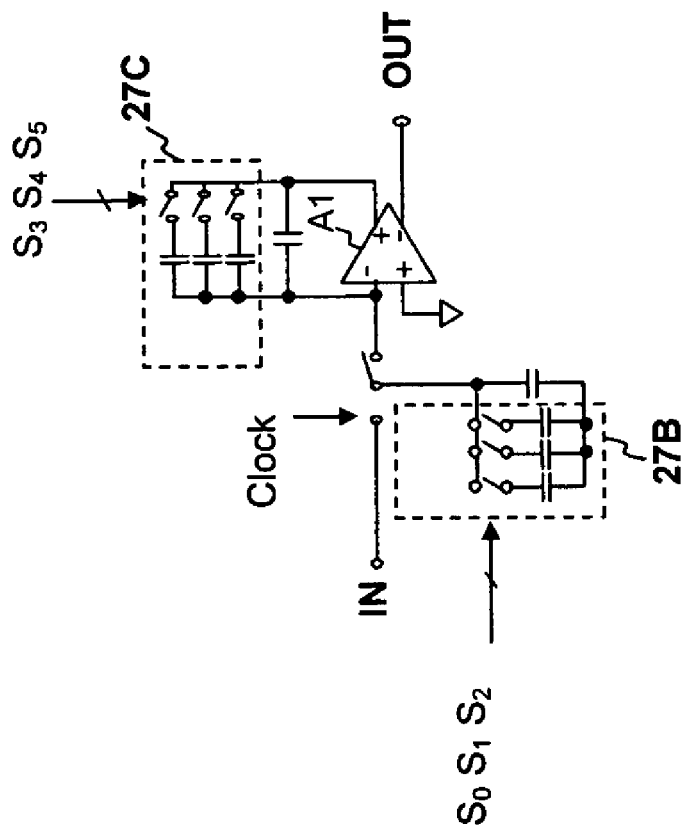
FIGS. 2A and 2B are schematic diagrams depicting embodiments of adjustable integrators 11 of FIG. 1.
Figure 2A:
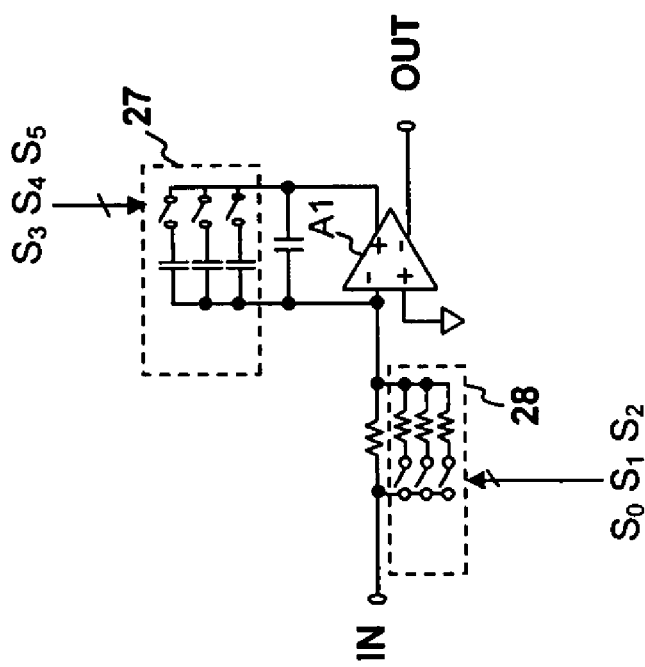

Referring now to FIG. 2A, one embodiment of an adjustable integrator 11 as may be used in the circuit of FIG. 1 is shown. The integrator depicted in FIG. 2A is implemented with a fully-differential amplifier A1 having an integrator constant set by a programmable feedback capacitance 27 responsive to digital control signals $S_3$-$S_5$ and a programmable input resistance 28 responsive to digital control signals $S_0$-$S_2$. Control signals $S_0$-$S_6$ are provided from control circuit 21 as determined by the NTF measurement described above.

Referring now to FIG. 2B, another embodiment of an adjustable integrator 11 as may be used in the circuit of FIG. 1 is shown. The integrator depicted in FIG. 2B is a switched-capacitor integrator also having an integrator constant set by a programmable feedback capacitance 27C responsive to digital control signals $S_3$-$S_5$ and a switched programmable input capacitance 27B responsive to digital control signals $S_0$-$S_2$ and is implemented with a fully differential amplifier A1. The input capacitance is switched by the Clock signal to provide an effective RC integrator as well-known in the art. As an alternative, or in combination, the frequency of the Clock signal can be varied to control the effective resistance of the switched input capacitance.

Figure 3B:
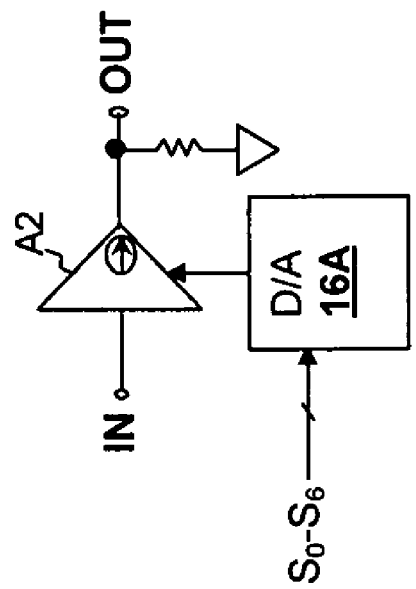
FIGS. 3A and 3B are schematic diagrams depicting embodiments of adjustable gain amplifier 12A of FIG. 1.
Figure 3A:
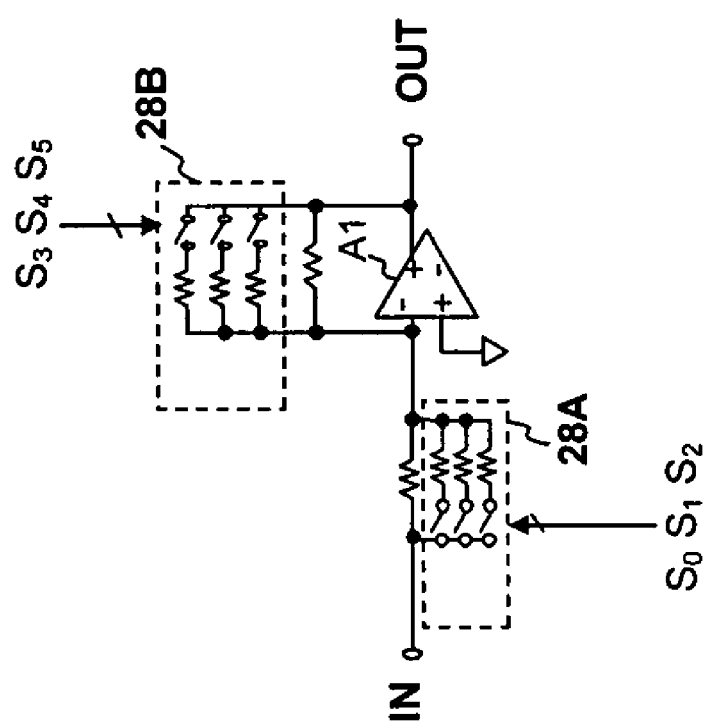

Referring now to FIG. 3A, one embodiment of an adjustable gain amplifier 12A as may be used in the circuit of FIG. 1 is shown. The amplifier depicted in FIG. 3A is implemented with a fully-differential amplifier A1 having a gain constant set by a programmable feedback resistance 28B responsive to digital control signals $S_3$-$S_5$ and a programmable input resistance 28A responsive to digital control signals $S_0$-$S_2$. Control signals $S_0$-$S_6$ are provided from control circuit 21 as determined by the NTF measurement described above, but are not necessarily the same control signals used to control programmable integrators 11 if both programmable integrators 11 and an adjustable gain amplifier 12A are used to implement the present invention, as the choice of using the same control signals will be based on a particular design and whether the logic for setting a particular switch is identical with that for another setting another switch.

FIG. 3B shows an alternative programmable gain amplifier 12A that employs an adjustable gain amplifier A2, such as an operational transconductance amplifier having a gain set by an analog voltage (or current) supplied by a DAC 16, which may be implemented by a current-sinking resistor ladder as is well-known in the art. In the present invention, adjustable gain amplifiers such as circuits depicted in FIGS. 3A-3B may be used alternatively in place of scaling circuits 12 to adjust the feed-forward amounts applied from the outputs of integrators 11 to summing circuit 13 or such amplifiers may be used in concert with the programmable integrators described above.

Figure 4A:
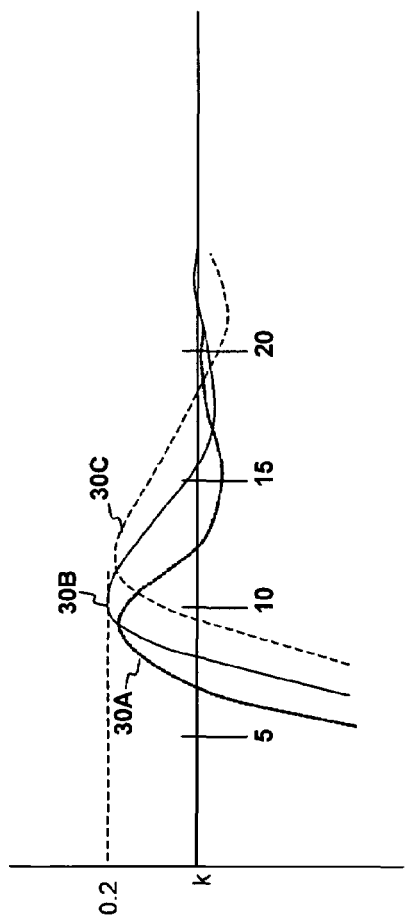
FIGS. 4A and 4B are graphs illustrating calibration adjustments of the present invention on the noise transfer function of a modulator in accordance with an embodiment of the present invention.
Figure 4B:
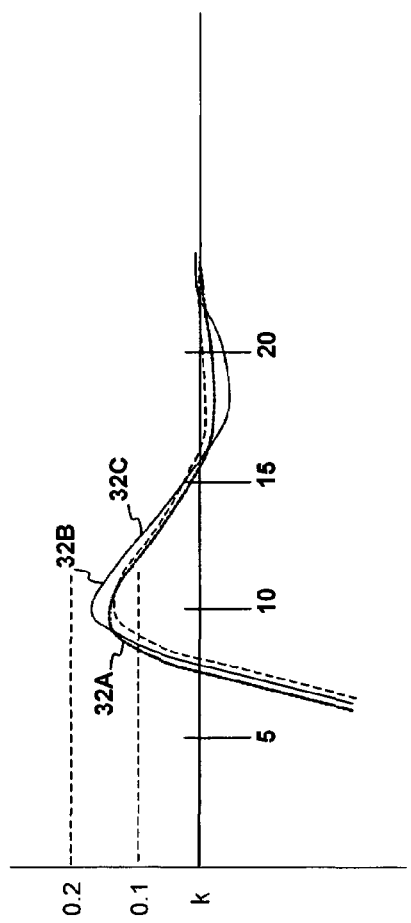

Referring now to FIGS. 4A-B, graphs of the NTF Z-domain response of modulator 10 is shown to illustrate methods of adjustment of modulator 10 by calibration circuits 20. FIG. 4A shows the Z-domain response 30B of modulator 10 with coefficient c1 adjusted to a nominal value, response 30A with c1 adjusted 20% low, and response 30C with c1 adjusted 20% high, where the input of quantizer 14 is given by $c_0I_0+c_1I_0 c_2I_2$, where $I_0$ is the output of the first integrator 11 of modulator 10 of FIG. 1, 11, 12 the outputs of the next two integrators 11 and $c_0$, $c_1$ and $c_2$ are the scaling coefficients used to combine the integrator output signals at combiner 13. The region around k=8 exhibits a high level of sensitivity to the value of c1 and thus provides a suitable region for control circuits 20 to detect the NTF response and make corrections to coefficient c1. Since coefficient c1 generally has more effect than coefficient c2 on the response of modulator 10, and is related to response values of lower k than coefficient c2, it is possible for control circuits 20 to adjust c1 first, especially in implementations such as the circuit of FIG. 1, where the earlier coefficients may be determined earlier if the value n applied to programmable delay 24 is progressively increased.

FIG. 4B shows the effect of changes in coefficient c2 on the Z-domain response of modulator 10. Response 32B shows the Z-domain response of modulator 10 with coefficient c1 adjusted to a nominal value, response 32A with c2 adjusted 20% low, and response 32C with c2 adjusted 20% high. The region around k=20 exhibits the highest sensitivity to the value of c2 and thus provides a suitable region for control circuits 20 to detect the NTF response and make corrections to coefficient c2.

Coefficient $c_0$ has the largest effect on the operation of modulator 10, and is generally set first from the very first measured Z-domain NTF coefficient, as $c_0$ dominates the earliest coefficients and in particular the first coefficient. Since earliest coefficients are the initial response of the modulator 10 loop to the injected noise, the second and third integrator have not exhibited any effect at their outputs from the injected noise until after the first integrator has changed in response to the injected noise. In a feedback implementation of a modulator, the opposite would be true, and the calibration algorithm adjusted accordingly.

Figure 5:
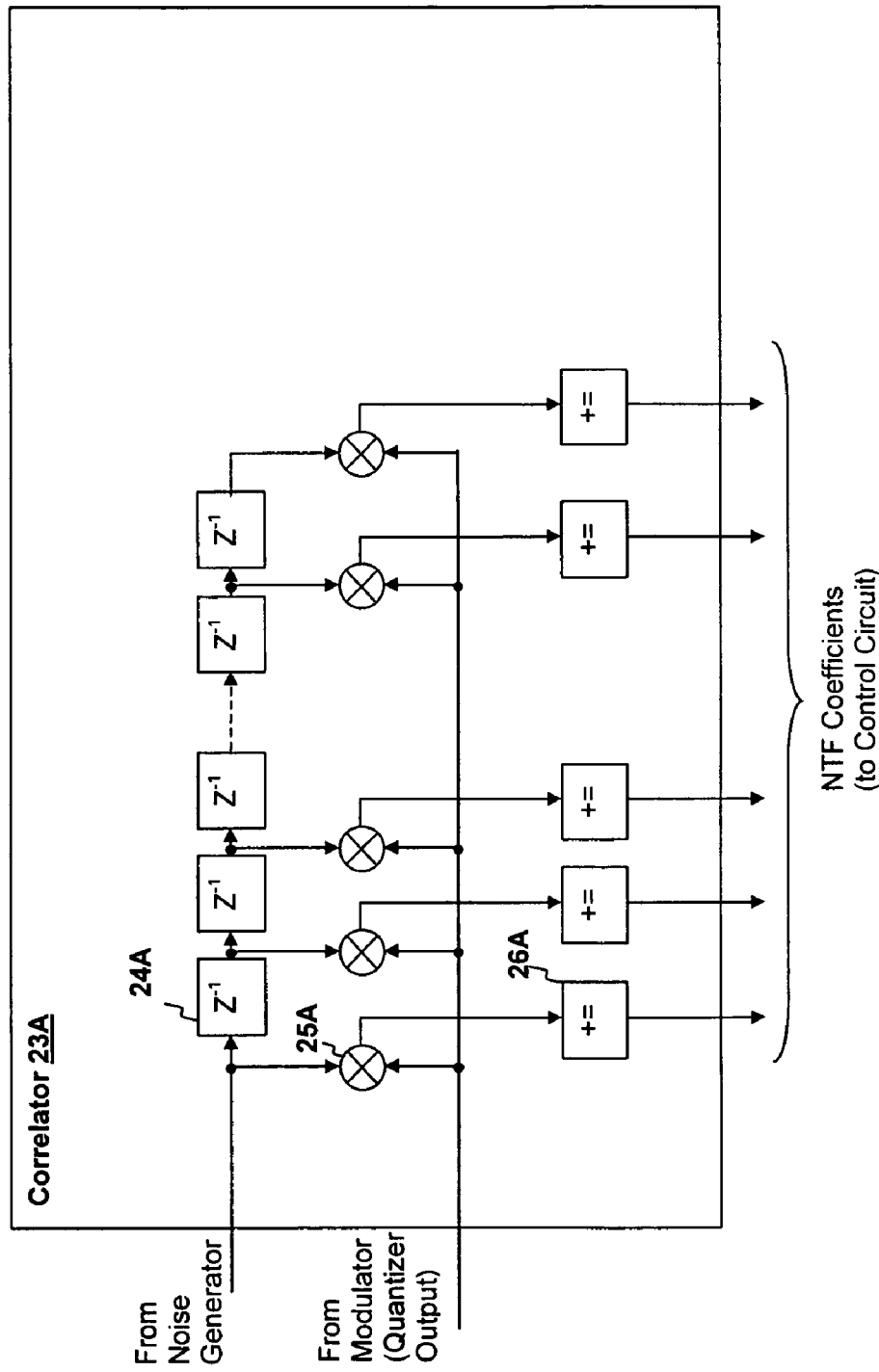
FIG. 5 is a block diagram depicting another correlator that may be used in the apparatus of FIG. 1.

Referring now to FIG. 5, another correlator circuit 23A that may be used in the circuit of FIG. 1 is shown in accordance with another embodiment of the present invention. Multiple sets of multipliers 25A and accumulators 26A are used to accumulate correlations of the output of modulator 10 of FIG. 1 with the injected noise signal from noise generator 22 of FIG. 1. A series of cascaded delay lines 24A provide the delays needed to accumulate each Z-domain coefficient of the NTF.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method for calibrating a delta-sigma modulator, said method comprising:
    injecting a noise signal into a feedback loop of said delta-sigma modulator from a noise generator;
    measuring a response of a quantizer of said delta-sigma modulator to said noise signal over a number of samples by delaying said noise signal to provide a delayed noise signal, wherein said delaying comprises delaying said output of said noise generator with a multi-tap delay; correlating an output of said delta-sigma modulator with said delayed noise signal to obtain at least one impulse response term of a noise transfer function of said delta-sigma modulator and wherein said correlating is performed for each tap of said multi-tap delay simultaneously to determine terms of said impulse response of said noise transfer function; and
    adjusting coefficients of said delta-sigma modulator to shape said noise transfer function in conformity with a result of said measuring, so that said noise transfer function more closely approximates a desired transfer function, wherein said adjusting is performed in conformity with a result of said correlating.

2. The method of claim 1, further comprising performing conversions using said delta-sigma modulator subsequent to completion of said adjusting, wherein said noise signal acts as a dither signal to conversions performed by said delta-sigma modulator.

3. A method for calibrating a delta-sigma modulator, said method comprising:
injecting a noise signal into a feedback loop of said delta-sigma modulator from a noise generator;
measuring a response of a quantizer of said delta-sigma modulator to said noise signal over a number of samples by delaying said noise signal to provide a delayed noise signal and correlating an output of said delta-sigma modulator with said delayed noise signal to obtain at least one impulse response term of a noise transfer function of said delta-sigma modulator;
adjusting coefficients of said delta-sigma modulator to shape said noise transfer function in conformity with a result of said measuring, so that said noise transfer function more closely approximates a desired transfer function, wherein said adjusting is performed in conformity with a result of said correlating;
accumulating terms of said impulse response of said noise transfer function;
summing accumulated terms of said impulse response of said noise transfer function;
determining when said sum is substantially equal to a step response;
in response to determining that said sum is substantially equal to said step response, halting said accumulating; and
performing said adjusting in conformity with said accumulated terms after said accumulating is halted.

4. The method of claim 3, further comprising:
setting said delta-sigma modulator to a calibration mode, and wherein said injecting and measuring are performed while said delta-sigma modulator is in a calibration mode; and
setting said delta-sigma modulator to an operating mode, wherein said injecting and measuring are ceased and wherein operation of said delta-sigma modulator is performed in conformity with a result of said adjusting.

5. The method of claim 3, wherein said adjusting is performed by sequentially adjusting coefficients of said loop filter from a lowest-order coefficient of said loop filter to a highest-order coefficient of said loop filter.

6. The method of claim 3, wherein said injecting injects said noise signal into an input of a quantizer of said delta-sigma modulator.

7. The method of claim 3, wherein said injecting combines said noise signal with an output of a quantizer of said delta-sigma modulator.

8. A delta-sigma modulator, comprising:
a delta-sigma modulator having adjustable coefficients;
a noise generator having an output coupled to a feedback loop of said delta-sigma modulator;
a measurement circuit for measuring a response of said delta-sigma modulator to said output of said noise generator, comprising a delay for delaying said output of said noise generator to provide a delayed noise signal and a correlator having a first input coupled to an output of said delay and a second input coupled to an output of said delta-sigma modulator a multiplier for multiplying said output of said delay with said output of said delta-sigma modulator and an accumulator for accumulating a result of said multiplying; and
a circuit for adjusting said adjustable coefficients in conformity with an output of said measurement circuit, so that a noise transfer function of said delta-sigma modulator more closely approximates a desired transfer function, wherein said circuit for adjusting receives indications in conformity with an impulse response of said noise transfer function.

9. The delta-sigma modulator of claim 8, wherein said measurement circuit comprises a digital signal processor.

10. The delta-sigma modulator of claim 8, wherein said delay has a selectable delay length and wherein said measurement circuit further comprises a selector for selecting said delay length, and wherein said accumulator accumulates each of a plurality of terms of said impulse response of said noise transfer function in sequence in conformity with a selecting of said delay length.

11. The delta-sigma modulator of claim 8, wherein said delay is a multi-tap delay, wherein said multiplier comprises an individual multiplier for each tap of said delay and wherein said accumulator comprises multiple accumulators for accumulating terms of said impulse response of said noise transfer function.

12. The delta-sigma modulator of claim 8, further comprising:
a circuit for adding accumulated terms of said impulse response of said noise transfer function; and
a comparison circuit for determining when said sum of said accumulated terms is substantially equal to a step response and wherein said circuit for adjusting is responsive to an output of said comparison circuit and only adjusts said coefficients when said sum of said accumulated terms is substantially equal to a step response.

13. The delta-sigma modulator of claim 8, further comprising:
a calibration mode select input signal; and
a selector for selectively coupling said noise generator to said feedback loop node of said delta-sigma modulator in response to assertion of said calibration mode select input signal.

14. The delta-sigma modulator of claim 8, wherein said noise generator is a dither generator, and wherein said noise generator output is coupled to said feedback loop of said delta-sigma modulator during operation of said delta-sigma modulator subsequent to said adjusting of said loop filter coefficients.

15. The delta-sigma modulator of claim 8, wherein said adjusting circuit sequentially adjusts coefficients of said loop filter from a lowest-order coefficient of said loop filter to a highest-order coefficient of said loop filter.

16. The delta-sigma modulator of claim 8, wherein said output of said noise generator is coupled to an input of a quantizer of said delta-sigma modulator.

17. The delta-sigma modulator of claim 8, wherein said output of said noise generator is combined with an output of a quantizer of said delta-sigma modulator and provided to said feedback loop.

* * * * *